United States Patent [19]

Sauerland

[11] Patent Number: 4,733,164

[45] Date of Patent: Mar. 22, 1988

[54] METHOD AND APPARATUS FOR FREQUENCY MEASUREMENT AND ADJUSTMENT OF MONOLITHIC CRYSTAL FILTERS

[76] Inventor: Franz L. Sauerland, 2851 Southington, Shaker Hts., Ohio 44120

[21] Appl. No.: 847,699

[22] Filed: Apr. 3, 1986

[51] Int. Cl.⁴ ..................... G01R 23/07; G01R 29/22
[52] U.S. Cl. ........................................ 324/56; 324/81
[58] Field of Search ................... 324/56, 57 Q, 578 S, 324/80, 81; 427/8, 10, 100; 29/25.35

[56] References Cited

U.S. PATENT DOCUMENTS

| | | | |
|---|---|---|---|
| 3,963,982 | 6/1976 | Roberts | 324/56 |
| 4,093,914 | 6/1978 | Peppiatt et al. | 324/56 |
| 4,447,782 | 5/1984 | Rutkoski | 324/56 |

Primary Examiner—Gerard R. Strecker
Assistant Examiner—Jack B. Harvey

[57] ABSTRACT

Method and apparatus for measuring the characteristic frequencies of a monolithic crystal filter and for adjusting them to predetermined values, based on selectively transmitting two balanced decoupled signals through the filter to an output signal detector for exciting and measuring the characteristic frequencies.

17 Claims, 6 Drawing Figures

METHOD AND APPARATUS FOR FREQUENCY MEASUREMENT AND ADJUSTMENT OF MONOLITHIC CRYSTAL FILTERS

This application is a continuation in part of an earlier application Ser. No. 801,295 filed Nov. 25, 1985, and entitled "Method and Apparatus for Frequency Adjustment of Monolithic Crystal Filters".

BACKGROUND

The present application is directed to a method and circuit for frequency measurement and also contemplates application of the frequency measurement method and circuit to both the frequency adjustment and the testing of monolithic filters.

A monolithic twopole crystal filter comprises two acoustically coupled resonators on one crystal wafer. The resonators are formed by two pairs of opposite electrodes, separated by a gap on at least one side of the wafer. Fine tuning the filter usually entails adjusting the center frequency and, preferably, also the bandwidth of the filter. The center frequency is determined by the two resonator frequencies, which can be adjusted by changing the mass of the electrodes. The bandwidth can be adjusted by changing the mass distribution over the area covered by the electrodes and the inter-electrode gap. For example, the bandwidth can be increased by depositing additional mass in the gap or its vicinity, such as the electrode edges adjacent to the gap. If the filter has only one gap, the bandwidth can also be increased by increasing the mass opposite the gap on the wafer side opposing the gap. Alternately, the bandwidth can be decreased by subtracting mass in the described areas or by adding mass to the electrode edges furthest removed from the gap. Changing the mass can be achieved by various means, such as mass addition by vacuum deposition or chemical action, and mass removal by laser.

In the following, several conventional Methods for fine tuning of monolithic crystal filters are described. They are all based on adjusting some of the characteristic series resonance frequencies of the twopole, which are defined as follows: an upper and lower short circuit frequency for each side of the twopole, each measured with the opposite side short circuited; an upper and lower open circuit frequency for each side of the twopole, each measured with the opposite side open circuited; a resonator frequency for each side of the twopole, each measured with the opposite side's static capacitance neutralized. These definitions will become more apparent by reference to the twopole equivalent circuit, which is explained farther below. If the twopole is symmetric, each characteristic frequency of one side equals the corresponding one on the other side.

Method 1 is based on U.S. Pat. No. 4,343,827, which pertains to fine tuning by using a transmission method for visually displaying and adjusting the short circuit amplitude versus frequency response. First, the resonator frequencies are equalized by balancing the amplitude peaks at the two short circuit frequencies by means of adding mass to the electrodes. Then, both resonator frequencies, which are located midway between the two short circuit frequencies, are lowered to target by further mass addition. The method does not allow adjustment of bandwidth.

Method 2 is based on Method 1 but includes fine tuning of the bandwidth, which is defined as the difference between the two short circuit frequencies and is adjusted by changing mass at the electrode gap or the electrode Methods 1 and 2 require both frequency and amplitude adjustment and have limited accuracy because they depend on judging frequencies from a visually displayed curve.

Method 3 is used in commercial equipment such as the "Twopole Plating System" by Transat Corp. It is based on oscillator measurement of the two resonator frequencies and the bandwidth, the latter being measured by a network that uses two oscillators for simultaneous oscillation at the upper and lower short circuit frequencies and subsequent mixing and filtering of these frequencies to monitor the bandwidth.

Method 4 is based on U.S. Pat. No. 4,093,914, which describes a "Method of Measuring Parameters of a Crystal Filter" by means of measuring the two short circuit and two open circuit frequencies for one side of a twopole and then calculating the two resonator frequencies and the bandwidth. The method is attractive because of its simple measurement but is apt to have increasing accuracy limitations toward higher frequencies.

Both Methods 3 and 4 depend on adjusting four frequencies during the tuning process.

In Methods 1-4 the main means of changing frequency is by way of metal deposition in vacuum, also called "plating". The deposition may be on one side or both sides of the filter wafer, and the selective mass distribution may be accomplished by one or more evaporation sources in conjunction with stationary or movable masking.

In both frequency adjustment and test of monolithic filters, the accuracy of frequency measurement is of critical importance. A disadvantage of the described prior art methods is that none of them allow for accurate automatic measurement over a large frequency range (100 MHz or more). Presumably the reason for this is as follows: The characteristic frequencies are related to different two-terminal interconnections of the three filter terminals. According to prior art, these frequencies can be measured in two ways: (a) by sequential manual interconnection and insertion of the three filter terminals into a two-terminal measurement fixture; in this case, the process cannot be automated, (b) by insertion of the filter into a three-terminal measurement circuit that allows access to the different two-terminal interconnections by electrical switching; in this case, conventional circuits have severe accuracy limitations at high operating frequencies, where the stray reactances of the measurement circuit approach the order of magnitude of the filter reactances and distort the measurement.

The present invention relates to an improvement to the frequency measurement according to the above electrical switching case (b). A novel three-terminal measurement circuit is adapted to be switched electrically for two-terminal measurement of the four main characteristic frequencies of a monolithic filter. The circuit is largely independent of the effect of stray reactances and allows accurate frequency measurement over a large frequency range. It has been tested up to 110 MHz and is expected to cover at least 150 MHz. It can be used for both the adjustment and test of monolithic filter frequencies.

SUMMARY OF THE INVENTION

1. In accordance with one aspect of the invention, a method for measuring up to four characteristic frequencies of a monolithic filter, said four frequencies comprising the symmetric and antisymmetric frequencies and the two resonator frequencies, and said method comprising the steps of
   a. selectively applying two decoupled balanced signals to first and second filter ports of the filter,
   b. transmitting said signals through the filter to an output signal detector for selectively exciting said characteristic frequencies,
   c. measuring said characteristic frequencies at the detector output.
2. In accordance with another aspect of the invention, there is added to the above mentioned steps a, b, c a fourth step
   d. selectively changing electrode mass distribution on the filter to adjust the characteristic frequencies concurrently with measuring the characteristic frequencies.
3. In accordance with another aspect of the invention, an apparatus for measuring up to four characteristic frequencies of a monolithic filter, said four frequencies comprising the symmetric and antisymmetric frequencies and the two resonator frequencies, and said apparatus comprising two balanced input signals that are decoupled from each other, an output signal detector, and switching means for selectively interconnecting the three terminals of a monolithic filter between the two balanced input signals and the output signal detector so as to selectively excite the characteristic frequencies by means of a signal transmission through the filter and to measure them at the detector output.
4. In accordance with another aspect of the invention, an apparatus for frequency adjustment of monolithic filters, comprising
   a. apparatus for monitoring up to four characteristic frequencies of a monolithic filter, said four frequencies comprising the symmetric and antisymmetric frequencies and the two resonator frequencies, and said apparatus comprising two balanced input signals that are decoupled from each other, an output signal detector, and switching means for selectively interconnecting the three terminals of a monolithic filter between the two balanced input signals and the output signal detector, so as to selectively excite the characteristic frequencies by means of signal transmission through the filter and to measure them at the detector output.
   b. apparatus for selectively adjusting said characteristic frequencies to predetermined values, said apparatus employing means for selectively changing the mass distribution on the filter wafer.

BRIEF DESCRIPTION OF THE DRAWINGS

For a better understanding of the invention, reference is made to the following description taken in connection with the accompanying drawings, and its scope is pointed out in the appended claims.

FIGS. 1-3 refer to prior art.

DESCRIPTION OF THE INVENTION

Figure 3:
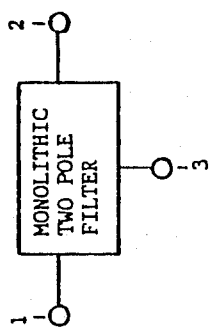
FIG. 3 shows a simplified schematic view of a monolithic twopole filter with three electrical terminals.
Figure 2:
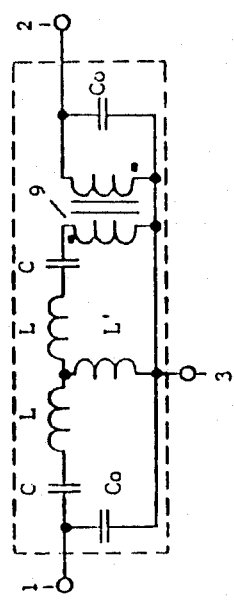
FIG. 2 shows the simplified lossless equivalent circuit of a symmetric monolithic twopole filter with inductive and capacitive circuit parameters and three electrical terminals.
Figure 1:
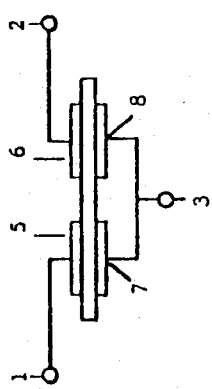
FIG. 1 shows a simplified schematic cross-sectional view of a twopole monolithic crystal filter with a crystal wafer, two sets of electrodes, and three electrical terminals.

The description is based on some further explanation of prior art, together with the prior art FIGS. 1-3.

FIG. 1 shows a schematic cross-sectional view of a monolithic twopole filter with three terminals 1, 2, 3, two two-terminal ports 1-3 and 2-3, a crystal wafer 4, and four electrodes 5, 6, 7, 8. Electrodes 7 and 8 are connected together and are sometimes formed as a single electrode that covers the gap between the electrodes. Electrode pairs 5-7 and 6-8 form resonators that are coupled together acoustically.

FIG. 2 shows the approximate lossless equivalent circuit of a symmetric twopole filter with the three terminals according to FIG. 1 and two types L and L' of inductors, two types C and $C_o$ of capacitors, and a 1:(−1) transformer 9. The $C_o$ are the static resonator capacitors, L and C are the motional parameters of the decoupled resonators, and L' is the coupling inductor. A simplified schematic representation of the filter is shown in FIG. 3 for use in subsequent figures.

The symmetric twopole circuit of FIG. 2 has the following characteristic series resonance frequencies:

$$F1 = F2 = \tfrac{1}{2}\pi \sqrt{(L + L')C} \qquad (1)$$

$$Fa = \tfrac{1}{2}\pi \sqrt{LC} \qquad (2)$$

$$Fs = \tfrac{1}{2}\pi \sqrt{(L + 2L')C} \qquad (3)$$

F1 and F2 are called the Resonator Frequencies of the filter's input resonator and output resonator, respectively. Fs is the Symmetric Frequency, Fa the Antisymmetric Frequency of the filter.

The four frequencies correspond to either of the following definitions:

Definition 1. F1 is the resonator frequency measured at filter port 1, with the static capacitance of filter port 2 neutralized. F2 is the resonator frequency measured at filter port 2, with the static capacitance of filter port 1 neutralized. Fs and Fa are the two series resonance frequencies measured at one filter port, with the opposite filter port short circuited.

Definition 2. F1 and F2 are defined as per (1). Fs is the series resonance frequency measured between filter terminals 1 and 3 if terminals 1 and 2 are connected together. Fa is the series resonance frequency measured between filter terminals 1 and 2 if terminal 3 is not connected.

Sometimes the definition of F1 and F2 is extended as follows: F1 is the resonator frequency measured at filter port 1, with the static capacitance of filter port 2 not neutralized or partially neutralized. F2 is the resonator frequency measured at filter port 2, with the static capacitance of filter port 1 not neutralized or partially neutralized. The present invention relates to both the exact and the extended definitions for F1 and F2.

In a symmetric filter the three frequencies F1, F2, Fs, in conjunction with the capacitors C and $C_o$ of FIG. 2, completely determine the filter response, i.e. the filter can be fine tuned by adjusting only these three frequencies to predetermined values.

Measurement circuits for the three-frequency approach are described in the earlier application Ser. No. 801,295. However, as set forth in the background, some monolithic filter adjustment and test methods are based on the four characteristic frequencies F1, F2, Fs, Fa. The fourth frequency provides additional flexibility for the characterization and frequency adjustment of symmetric and nonsymmetric monolithic filters. It is the purpose of this application to cover both three-and four-frequency measurements.

Figure 4:
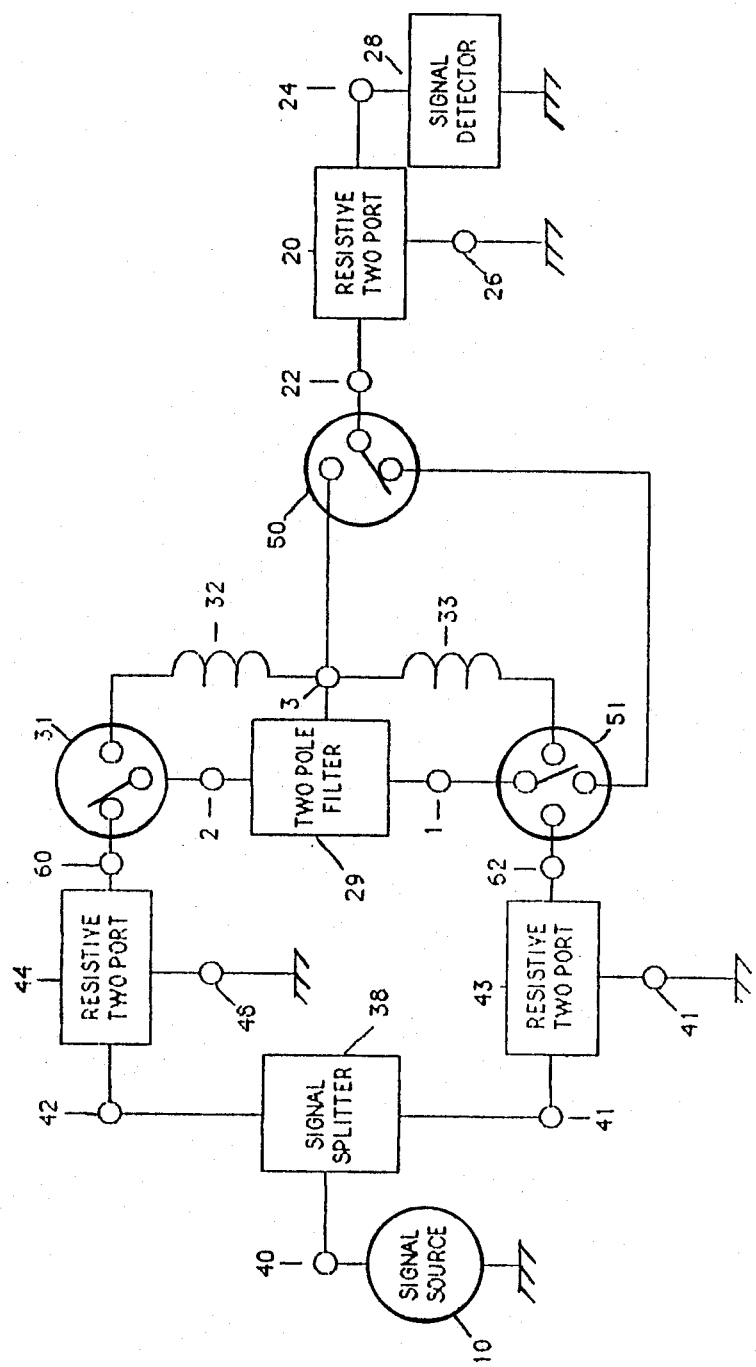
FIG. 4 shows a schematic view of a transmission measurement circuit according to the invention, with a monolithic twopole filter connected in a balanced transmission network.

FIG. 4 shows a basic circuit according to the invention for measuring the characteristic frequencies of a monolithic twopole filter 29 with terminals 1, 2 and 3. The circuit includes: (a) input signal means including a signal source 10, a signal splitter 38 with an input terminal 40 connected to the signal source and two output terminals 41 and 42 for applying a balanced signal each through the identical attenuating transmission networks 43 and 44 to input terminals 60 and 62; (b) output signal means, including an attenuating transmission network 20 with an input port 22 and an output port 24, and a signal detector 28 connected to port 24; (c) two inductors 33 and 32, connectable in parallel to the twopole ports 1 and 2, respectively, for neutralizing the shunt capacitance at these ports at a specific operating frequency; (d) switching means comprising switches 31, 51 and 50 for selectively interconnecting the twopole with the circuit means (a), (b), and (c) for selectively exciting and detecting the characteristic frequencies F1, F2, Fs and Fa according to above Definition 2.

F1, F2, Fs and Fa can be measured by setting the switches in the following positions: For F1, set switch 51 to the left position, switch 31 to the right, and switch 50 to the up position. For F2, set switch 51 to the right, switch 31 to the left, and switch 50 to the up position. For Fs, set switches 31 and 51 to the left and switch 50 to the up position. For Fa, set switch 31 to the left, switch 51 to the center position, and switch 50 to the down position.

The attenuating transmission networks are resistive twoports that may have various configurations, including the so-called Pi network, which comprises three resistors connected in a $\pi$-configuration and is standardized according to the International Electrotechnical Commission's (IEC) Document No. 444.

The fundamental characteristic and advantage of the circuit FIG. 4 is based on the discovery that (a) among the various stray reactances in a measurement circuit, the ones that cause direct capacitive coupling between the filter ports 1 and 2 are the most harmful to the measurement accuracy, and (b) this direct capacitive coupling can be eliminated by using balanced input signals that are decoupled from each other. Accordingly, the resistive twoports 44 and 43 of FIG. 4 provide signal attenuation, causing their respective output terminals 60 and 62 as well as the balanced signals at these terminals to be substantially decoupled from each other. Hence, when terminals 60 and 62 are connected via switches 31 and 51 to the two filter ports 1 and 2, the stray reactances of switches and circuitry at the two filter ports are also decoupled from each other.

Figure 5:
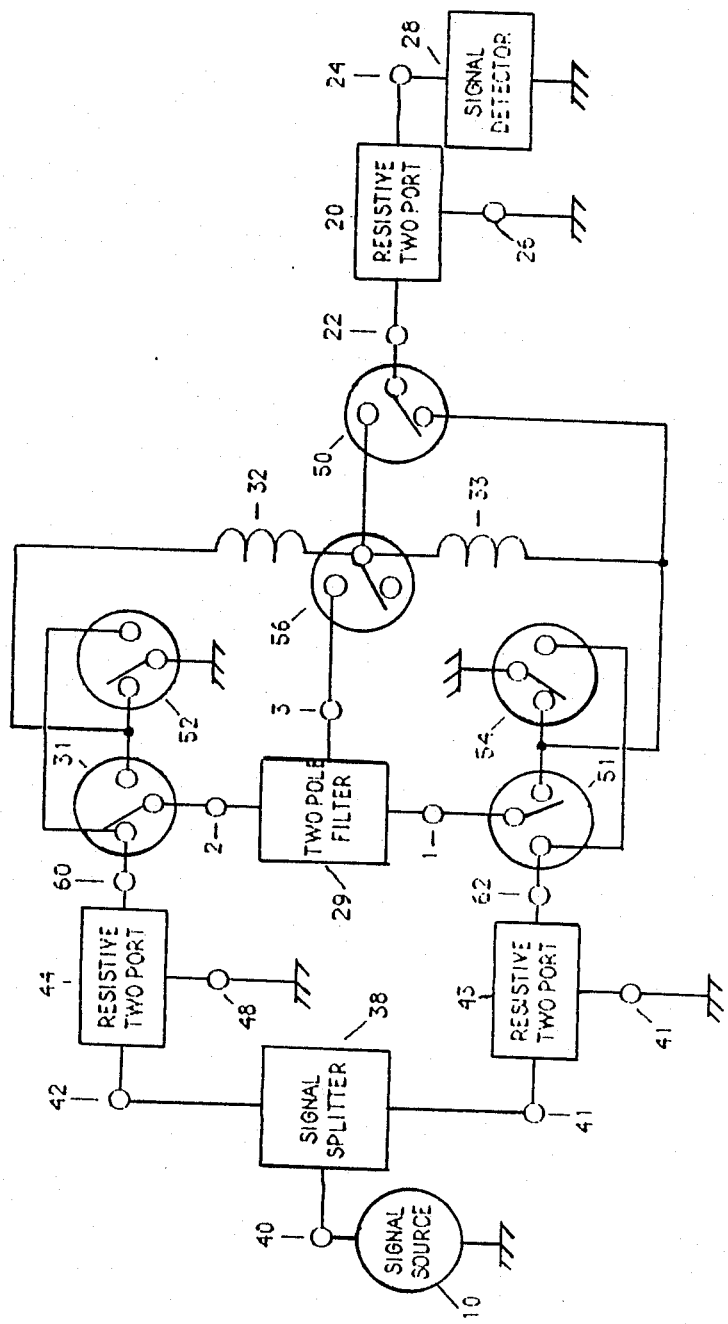
FIGS. 5 and 6 show alternate embodiments of transmission measurement circuits according to the present invention.

FIG. 5 shows an alternate embodiment to the circuit of FIG. 4. It is in accordance with a specific practical implementation and contains most of the elements of the circuit FIG. 4, such as signal source 10, signal splitter 38, resistive twoport networks 20, 43 and 44, twopole 29, inductors 32 and 33, and detector 28. The circuit of FIG. 5 differs from that of FIG. 4 mainly by the number and arrangement of switches and their interconnections. The extended circuitry has several purposes: (a) to ground an input signal when it is not connected to the filter. This prevents this signal from feeding through the switch capacitance to the measurement output. (b) to ground an inductor when it is not connected to neutralize the static filter capacitance, and (c) to suit available double pole, double throw Radio Frequency relays, which allow the consolidation of the six switches 51, 31, 50, 52, 54, 56 in three relays.

The circuit of FIG. 5 allows the measurement of F1, F2, Fs and Fa by setting the switches in the following positions: For F1, set switches 51 and 54 to the left position, switches 31 and 52 to the right, and switches 56 and 50 to the up position. For F2, set switches 51 and 54 to the right, switches 31 and 52 to the left, and switches 56 and 50 to the up position. For Fs, set switches 51, 54, 31 and 52 to the left and switches 56 and 50 to the up position. For Fa set switches 31 and 52 to the left, switches 51 and 54 to the right, and switches 56 and 50 to the down position.

Figure 6:
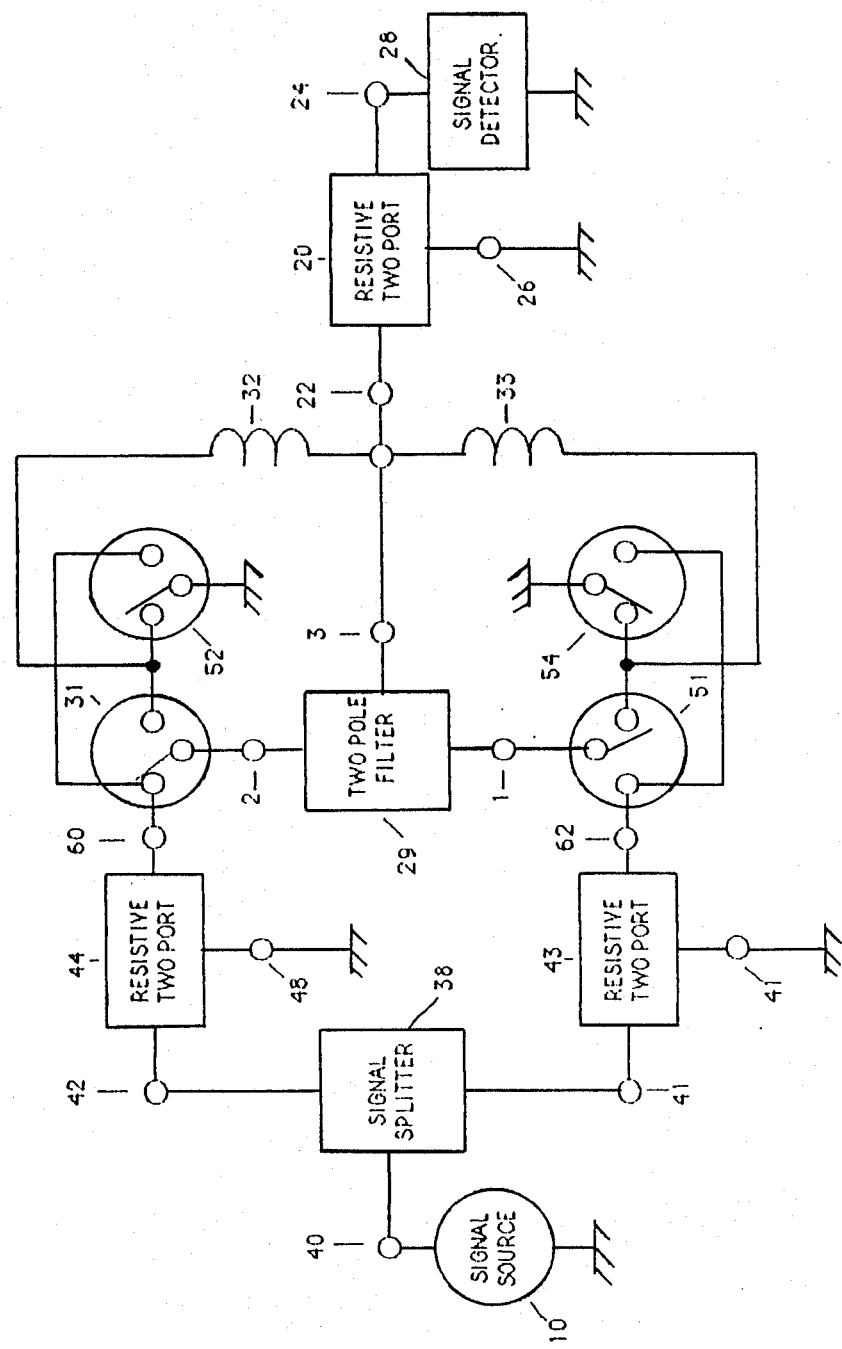

If only the three characteristic frequencies F1, F2 and F3 are to be measured, the circuit of FIG. 5 can be simplified by eliminating switches 50 and 56. The resulting simplified circuit is shown in FIG. 6.

The measurement approach according to the present invention has two major applications. One is testing semi-finished and finished filters. The other is monitoring the characteristic frequencies of a filter during the process of adjusting these frequencies to predetermined values. This process is based, for example, on changing the distribution of mass on the filter's crystal wafer. One common approach comprises vacuum deposition of a metal film on selected portions of the filter's electrode configuration. Details of this approach are explained in the Background section. The measurement approach according to this invention provides enhanced accuracy for the frequency adjustment process, especially at high operating frequencies.

While there have been described what are at present considered to be the preferred embodiments of this invention, it will be obvious to those skilled in the art that various changes and modifications may be made therein without departing from the invention, and it is intended, therefore, that the appended claims be construed to cover all such changes and modifications as fall within the true spirit and scope of the invention.

I claim:

1. A method for measuring up to four characteristic frequencies of a monolithic filter, said four frequencies including symmetric and antisymmetric frequencies and two resonator frequencies, and said method comprising the steps of:
   a. selectively applying two decoupled balanced signals to first and second filter ports of the filter;
   b. transmitting said decoupled balanced signals through the filter to an output signal detector, such that said characteristic frequencies of the filter are selectively excited;

c. measuring said excited characteristic frequencies at the output signal detector.

2. The method according to claim 1 wherein the selective signal application step includes sequentially:
   a. applying a first balanced signal only to the first of the filter ports to excite a first of the resonator frequencies;
   b. applying a second balanced signal only to the second of the filter ports to excite a second of the resonator frequencies;
   c. applying the first and second balanced signals simultaneously to the first and second filter ports to excite the symmetric frequency; and
   d. applying a first balanced signal to a series connection of the first and second filter ports to excite the antisymmetric frequency.

3. The method according to claim 1 wherein the selective signal application step includes sequentially;
   a. applying a first balanced signal only to the first of the filter ports to excite a first of the resonator frequencies;
   b. applying a second balanced signal only to the second of the filter ports to excite a second of the resonator frequencies; and
   c. applying a first balanced signal only to the first of the filter ports while short circuiting the second filter port to excite the symmetric and antisymmetric frequencies.

4. The method according to claim 1 further including selectively changing electrode mass distribution on the filter to adjust the characteristic frequencies concurrently with at least the step of measuring the characteristic frequencies.

5. The method according to claim 2 further including selectively changing electrode mass distribution on the filter to adjust the characteristic frequencies concurrently with at least the step of measuring the characteristic frequencies.

6. The method according to claim 3 further including selectively changing electrode mass distribution on the filter to adjust the characteristic frequencies concurrently with at least the step of measuring the characteristic frequencies.

7. An apparatus for measuring up to four characteristic frequencies of a monolithic filter, said four frequencies including the symmetric and antisymmetric frequencies and two resonator frequencies, and said apparatus comprising:
   a. a signal input means for providing two balanced input signals that are decoupled from each other,
   b. an output signal detector, and
   c. switching means for selectively interconnecting the terminals of a monolithic filter with the signal input means and with the output signal detector so as to selectively excite and measure the characteristic frequencies by means of selective signal transmission through the filter and signal detection in the output signal detector.

8. The apparatus according to claim 7, wherein the signal input means comprises a signal source, a signal splitter for splitting a signal from the source into two balanced signals, and two attenuating transmission networks operatively connected with the signal splitter such that each attenuates only one of the balanced signals.

9. The apparatus according to claim 8 wherein another attenuating transmission network is connected between the switching means and the output signal detector.

10. The apparatus according to claim 7 where the switching means sequentially applies a first of the balanced signals only to a first of the filter ports to excite a first of the resonator frequencies, applies a second of the balanced signals only to a second of the filter ports to excite a second of the resonator frequencies, applies the first and second balanced signals simultaneously to the first and second filter ports, respectively, to excite the symmetric frequency, and applies the first balanced signal to a series connection of the first and second filter ports to excite the antisymmetric frequency.

11. The apparatus according to claim 7 where the switching means sequentially applies a first of the balanced signals only to a first of the filter ports to excite a first of the resonator frequencies, applies a second of the balanced signals only to the second of the filter ports to excite a second of the resonator frequencies, and applies the first balanced signal only to the first of the filter ports while short circuiting the second filter port to excite the symmetric and antisymmetric frequencies.

12. The apparatus according to claim 7 further including one inductor each connected in shunt with each of the two filter ports for neutralizing the shunt capacitance of each filter port.

13. The apparatus according to claim 7, further including means for selectively adjusting a mass distribution on the filter for adjusting the measured characteristic frequencies to predetermined values.

14. The apparatus according to claim 8, further including means for selectively adjusting a mass distribution on the filter for adjusting the measured characteristic frequencies to predetermined values.

15. The apparatus according to claim 9, further including means for selectively adjusting a mass distribution on the filter for adjusting the measured characteristic frequencies to predetermined values.

16. The apparatus according to claim 10, further including means for selectively adjusting a mass distribution on the filter for adjusting the measured characteristic frequencies to predetermined values.

17. The apparatus according to claim 11, further including means for selectively adjusting a mass distribution on the filter for adjusting the measured characteristic frequencies to predetermined values.

* * * * *